(12) United States Patent
Salter et al.

(10) Patent No.: US 10,778,223 B2
(45) Date of Patent: Sep. 15, 2020

(54) HIDDEN SWITCH ASSEMBLY

(71) Applicant: Ford Global Technologies, LLC, Dearborn, MI (US)

(72) Inventors: Stuart Salter, White Lake, MI (US); Yun Shin Lee, Shelby Township, MI (US); James J. Surman, Clinton Township, MI (US); Paul Kenneth Dellock, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 270 days.

(21) Appl. No.: 15/959,426

(22) Filed: Apr. 23, 2018

(65) Prior Publication Data
US 2019/0326908 A1    Oct. 24, 2019

(51) Int. Cl.
*H03K 17/96* (2006.01)
*B60Q 3/43* (2017.01)
(Continued)

(52) U.S. Cl.
CPC ............. *H03K 17/962* (2013.01); *B60Q 3/14* (2017.02); *B60Q 3/43* (2017.02); *B60Q 3/54* (2017.02); *B60Q 3/64* (2017.02); *B60Q 3/82* (2017.02); *B60R 13/0243* (2013.01); *F21V 23/0442* (2013.01); *B60Q 2500/10* (2013.01);
(Continued)

(58) Field of Classification Search
CPC ............... H03K 17/962; H03K 17/955; H03K 2217/960795; H03K 2217/96042; F21V 23/0442; B60R 13/0243; B60Q 3/64; B60Q 3/82; B60Q 3/43; B60Q 2500/10; B60Q 3/14; B60Q 3/54; F21Y 2115/10; B60K 35/00

See application file for complete search history.

(56) References Cited

U.S. PATENT DOCUMENTS 2,486,859 A    11/1949    Meijer et al.
5,053,930 A    10/1991    Benavides
(Continued)

FOREIGN PATENT DOCUMENTS

CN    101337492 A    1/2009
CN    201169230 Y    2/2009
(Continued)

*Primary Examiner* — Daniel R Miller
(74) *Attorney, Agent, or Firm* — David Coppiellie; Price Heneveld LLP (57) ABSTRACT

A switch assembly comprising a housing configured to operably couple to a trim panel and defining a cavity, a feedback device operably coupled to the housing and positioned within the cavity, a printed circuit board operably coupled to the feedback device, a proximity sensor operably coupled to a connector and configured to actuate the feedback device, and a light source operably coupled the printed circuit board and configured to luminesce in response to actuation of the proximity sensor. The trim panel comprises a panel substrate operably coupled to a backup layer, an icon layer positioned within the cavity and operably coupled to the backup layer, an outline positioned about a periphery of the backup layer, and a translucent panel skin bonded to a foam layer positioned over the panel substrate, wherein the panel skin stretches over the panel substrate and the backup layer.

18 Claims, 7 Drawing Sheets

(51) Int. Cl.
  *B60Q 3/82* (2017.01)
  *B60Q 3/64* (2017.01)
  *B60R 13/02* (2006.01)
  *F21V 23/04* (2006.01)
  *B60Q 3/14* (2017.01)
  *B60Q 3/54* (2017.01)
  *F21Y 115/10* (2016.01)
  *H03K 17/955* (2006.01)

(52) U.S. Cl.
  CPC ......... *F21Y 2115/10* (2016.08); *H03K 17/955* (2013.01); *H03K 2217/96042* (2013.01); *H03K 2217/96062* (2013.01)

(56) References Cited

U.S. PATENT DOCUMENTS

| | | |
|---|---|---|
| 5,434,013 A | 7/1995 | Fernandez |
| 5,709,453 A | 1/1998 | Krent et al. |
| 5,839,718 A | 11/1998 | Hase et al. |
| 6,031,511 A | 2/2000 | DeLuca et al. |
| 6,117,362 A | 9/2000 | Yen et al. |
| 6,294,990 B1 | 9/2001 | Knoll et al. |
| 6,419,854 B1 | 7/2002 | Yocom et al. |
| 6,464,381 B2 | 10/2002 | Anderson, Jr. et al. |
| 6,494,490 B1 | 12/2002 | Trantoul |
| 6,577,073 B2 | 6/2003 | Shimizu et al. |
| 6,729,738 B2 | 5/2004 | Fuwausa et al. |
| 6,737,964 B2 | 5/2004 | Samman et al. |
| 6,773,129 B2 | 8/2004 | Anderson, Jr. et al. |
| 6,820,888 B1 | 11/2004 | Griffin |
| 6,851,840 B2 | 2/2005 | Ramamurthy et al. |
| 6,859,148 B2 | 2/2005 | Miller |
| 6,871,986 B2 | 3/2005 | Yamanaka et al. |
| 6,953,536 B2 | 10/2005 | Yen et al. |
| 6,990,922 B2 | 1/2006 | Ichikawa et al. |
| 7,015,407 B2 | 3/2006 | Hein |
| 7,015,893 B2 | 3/2006 | Li et al. |
| 7,161,472 B2 | 1/2007 | Strumolo et al. |
| 7,213,923 B2 | 5/2007 | Liu et al. |
| 7,216,997 B2 | 5/2007 | Anderson, Jr. |
| 7,249,869 B2 | 7/2007 | Takahashi et al. |
| 7,264,366 B2 | 9/2007 | Hulse |
| 7,264,367 B2 | 9/2007 | Hulse |
| 7,347,576 B2 | 3/2008 | Wang et al. |
| 7,441,914 B2 | 10/2008 | Palmer et al. |
| 7,501,749 B2 | 3/2009 | Takeda et al. |
| 7,575,349 B2 | 8/2009 | Bucher et al. |
| 7,635,212 B2 | 12/2009 | Seidler |
| 7,726,856 B2 | 6/2010 | Tsutsumi |
| 7,745,818 B2 | 6/2010 | Sofue et al. |
| 7,753,541 B2 | 7/2010 | Chen et al. |
| 7,834,548 B2 | 11/2010 | Jousse et al. |
| 7,862,220 B2 | 1/2011 | Cannon et al. |
| 7,987,030 B2 | 7/2011 | Flores et al. |
| 8,016,465 B2 | 9/2011 | Egerer et al. |
| 8,022,818 B2 | 9/2011 | la Tendresse et al. |
| 8,044,415 B2 | 10/2011 | Messere et al. |
| 8,066,416 B2 | 11/2011 | Bucher |
| 8,071,988 B2 | 12/2011 | Lee et al. |
| 8,097,843 B2 | 1/2012 | Agrawal et al. |
| 8,118,441 B2 | 2/2012 | Hessling |
| 8,120,236 B2 | 2/2012 | Auday et al. |
| 8,136,425 B2 | 3/2012 | Bostick |
| 8,162,519 B2 | 4/2012 | Salter et al. |
| 8,163,201 B2 | 4/2012 | Agrawal et al. |
| 8,169,131 B2 | 5/2012 | Murazaki et al. |
| 8,178,852 B2 | 5/2012 | Kingsley et al. |
| 8,197,105 B2 | 6/2012 | Yang |
| 8,203,260 B2 | 6/2012 | Li et al. |
| 8,207,511 B2 | 6/2012 | Bortz et al. |
| 8,232,533 B2 | 7/2012 | Kingsley et al. |
| 8,247,761 B1 | 8/2012 | Agrawal et al. |
| 8,261,686 B2 | 9/2012 | Birman et al. |
| 8,286,378 B2 | 10/2012 | Martin et al. |
| 8,317,329 B2 | 11/2012 | Seder et al. |
| 8,317,359 B2 | 11/2012 | Harbers et al. |
| 8,408,766 B2 | 4/2013 | Wilson et al. |
| 8,415,642 B2 | 4/2013 | Kingsley et al. |
| 8,421,811 B2 | 4/2013 | Odland et al. |
| 8,449,156 B2 | 5/2013 | Salter et al. |
| 8,459,832 B2 | 6/2013 | Kim |
| 8,466,438 B2 | 6/2013 | Lambert et al. |
| 8,475,017 B2 | 7/2013 | Salter et al. |
| 8,519,359 B2 | 8/2013 | Kingsley et al. |
| 8,519,362 B2 | 8/2013 | Labrot et al. |
| 8,539,702 B2 | 9/2013 | Li et al. |
| 8,552,848 B2 | 10/2013 | Rao et al. |
| 8,606,430 B2 | 12/2013 | Seder et al. |
| 8,624,716 B2 | 1/2014 | Englander |
| 8,631,598 B2 | 1/2014 | Li et al. |
| 8,653,553 B2 | 2/2014 | Yamazaki et al. |
| 8,664,624 B2 | 3/2014 | Kingsley et al. |
| 8,683,722 B1 | 4/2014 | Cowan |
| 8,724,054 B2 | 5/2014 | Jones |
| 8,754,426 B2 | 6/2014 | Marx et al. |
| 8,773,012 B2 | 7/2014 | Ryu et al. |
| 8,846,184 B2 | 9/2014 | Agrawal et al. |
| 8,851,694 B2 | 10/2014 | Harada |
| 8,876,352 B2 | 11/2014 | Robbins et al. |
| 8,905,610 B2 | 12/2014 | Coleman et al. |
| 8,952,341 B2 | 2/2015 | Kingsley et al. |
| 8,994,495 B2 | 3/2015 | Dassanayake et al. |
| 9,006,751 B2 | 4/2015 | Kleo et al. |
| 9,018,833 B2 | 4/2015 | Lowenthan et al. |
| 9,057,021 B2 | 6/2015 | Kingsley et al. |
| 9,059,378 B2 | 6/2015 | Verger et al. |
| 9,065,447 B2 | 6/2015 | Buttolo et al. |
| 9,067,530 B2 | 6/2015 | Bayersdorfer et al. |
| 9,187,034 B2 | 11/2015 | Tarahomi et al. |
| 9,298,065 B1 | 3/2016 | Samardzic et al. |
| 9,299,887 B2 | 3/2016 | Lowenthal et al. |
| 9,315,148 B2 | 4/2016 | Schwenke et al. |
| 9,452,709 B2 | 9/2016 | Aburto Crespo |
| 9,568,659 B2 | 2/2017 | Verger et al. |
| 9,616,812 B2 | 4/2017 | Sawayanagi |
| 2002/0159741 A1 | 10/2002 | Graves et al. |
| 2002/0163792 A1 | 11/2002 | Formoso |
| 2003/0167668 A1 | 9/2003 | Fuks et al. |
| 2003/0179548 A1 | 9/2003 | Becker et al. |
| 2004/0213088 A1 | 10/2004 | Fuwausa |
| 2005/0084229 A1 | 4/2005 | Babbitt et al. |
| 2005/0189795 A1 | 9/2005 | Roessler |
| 2006/0087826 A1 | 4/2006 | Anderson, Jr. |
| 2006/0097121 A1 | 5/2006 | Fugate |
| 2007/0032319 A1 | 2/2007 | Tufte |
| 2007/0285938 A1 | 12/2007 | Palmer et al. |
| 2007/0297045 A1 | 12/2007 | Sakai et al. |
| 2008/0205075 A1 | 8/2008 | Hikmet et al. |
| 2009/0217970 A1 | 9/2009 | Zimmerman et al. |
| 2009/0219730 A1 | 9/2009 | Syfert et al. |
| 2009/0251920 A1 | 10/2009 | Kino et al. |
| 2009/0260562 A1 | 10/2009 | Folstad et al. |
| 2009/0262515 A1 | 10/2009 | Lee et al. |
| 2010/0102736 A1 | 4/2010 | Hessling |
| 2011/0012062 A1 | 1/2011 | Agrawal et al. |
| 2011/0265360 A1 | 11/2011 | Podd et al. |
| 2012/0001406 A1 | 1/2012 | Paxton et al. |
| 2012/0104954 A1 | 5/2012 | Huang |
| 2012/0183677 A1 | 7/2012 | Agrawal et al. |
| 2012/0280528 A1 | 11/2012 | Dellock et al. |
| 2013/0050979 A1 | 2/2013 | Van De Ven et al. |
| 2013/0092965 A1 | 4/2013 | Kijima et al. |
| 2013/0327674 A1 | 12/2013 | Stephens et al. |
| 2013/0335994 A1 | 12/2013 | Mulder et al. |
| 2014/0003044 A1 | 1/2014 | Harbers et al. |
| 2014/0029281 A1 | 1/2014 | Suckling et al. |
| 2014/0065442 A1 | 3/2014 | Kingsley et al. |
| 2014/0103258 A1 | 4/2014 | Agrawal et al. |
| 2014/0211498 A1 | 7/2014 | Cannon et al. |
| 2014/0264396 A1 | 9/2014 | Lowenthal et al. |
| 2014/0266666 A1 | 9/2014 | Habibi |
| 2014/0373898 A1 | 12/2014 | Rogers et al. |
| 2015/0046027 A1 | 2/2015 | Sura et al. |

(56) References Cited

U.S. PATENT DOCUMENTS

| | | |
|---|---|---|
| 2015/0085488 A1 | 3/2015 | Grote, III et al. |
| 2015/0109602 A1 | 4/2015 | Martin et al. |
| 2015/0138789 A1 | 5/2015 | Singer et al. |
| 2015/0267881 A1 | 9/2015 | Salter et al. |
| 2015/0307033 A1 | 10/2015 | Preisler et al. |
| 2016/0016506 A1 | 1/2016 | Collins et al. |
| 2016/0102819 A1 | 4/2016 | Misawa et al. |
| 2016/0131327 A1 | 5/2016 | Moon et al. |
| 2016/0236613 A1 | 8/2016 | Trier |
| 2016/0240794 A1 | 8/2016 | Yamada et al. |
| 2016/0274664 A1* | 9/2016 | Buttolo ............... H03K 17/955 |
| 2017/0158125 A1 | 6/2017 | Schuett et al. |
| 2017/0253179 A1 | 9/2017 | Kumada |
| 2019/0275932 A1* | 9/2019 | Cho ....................... H01H 9/161 |

FOREIGN PATENT DOCUMENTS

| | | |
|---|---|---|
| CN | 201193011 Y | 2/2009 |
| CN | 204127823 U | 1/2015 |
| DE | 4120677 A1 | 1/1992 |
| DE | 29708699 U1 | 7/1997 |
| DE | 10319396 A1 | 11/2004 |
| EP | 1793261 A1 | 6/2007 |
| EP | 2778209 A1 | 9/2014 |
| JP | 2000159011 A | 6/2000 |
| JP | 2007238063 A | 9/2007 |
| KR | 20060026531 A | 3/2006 |
| WO | 2006047306 A1 | 5/2006 |
| WO | 2014068440 A1 | 5/2014 |
| WO | 2014161927 A1 | 10/2014 |

* cited by examiner

HIDDEN SWITCH ASSEMBLY

FIELD OF THE INVENTION

The present invention generally relates to a switch assembly and more specifically to a hidden switch assembly.

BACKGROUND OF THE INVENTION

As more features requiring user input are added to the interior of a vehicle, the interior of the vehicle is becoming overcrowded with switches and controls. It is therefore desirable to find aesthetically pleasing ways of incorporating switches into the interior of the vehicle without overcrowding the interior surfaces, such as the instrument panel and trim pieces. Accordingly, a switch assembly configured to be hidden unless activated to luminesce is provided herein.

SUMMARY OF THE INVENTION

According to one aspect of the present invention, a switch assembly comprises a housing configured to couple to a trim panel and defining a cavity, a feedback device coupled to the housing and positioned within the cavity, a printed circuit board coupled to the feedback device, a proximity sensor coupled to a connector and configured to actuate the feedback device, and a light source coupled to the printed circuit board and configured to luminesce in response to actuation of the proximity sensor. The panel comprises a panel substrate coupled to a backup layer, an icon layer positioned within the cavity and coupled to the backup layer, an outline positioned about a periphery of the backup layer, and a translucent panel skin bonded to a foam layer positioned over the panel substrate. The panel skin stretches over the panel substrate and the backup layer.

Embodiments of the first aspect of the invention can include any one or a combination of the following features:
The light source is positioned on a first opposing side of the printed circuit board, and the feedback device is positioned on a second opposing side of the printed circuit board; and/or
The light source is configured to change color in response to activation of the proximity sensor.

According to second aspect of the present invention, a switch assembly for a vehicle comprises a housing coupled to a panel, wherein the housing contains a feedback device coupled to a first side of a printed circuit board, and a light source coupled to a second side of the printed circuit board, wherein the light source is configured to illuminate through an icon layer and a panel skin.

Embodiments of the second aspect of the invention can include any one or a combination of the following features:
The panel comprises a panel substrate coupled to a backup layer, an outline bonded to the backup layer, a foam layer positioned over the panel substrate and positioned flush with the outline, and the panel skin coupled to the foam layer and positioned on top of the backup layer;
The backup layer and the icon layer are translucent;
The icon layer includes indicia configured to be illuminated by the light source;
The indicia include a luminescent material configured to luminesce in response to illumination of the light source; and/or
The panel skin is configured to conceal the switch assembly when the light source is not illuminated.

According to third aspect of the present invention, a switch assembly comprises a housing, a backup layer coupled to a panel substrate, wherein the backup layer and the housing define a cavity, a feedback device positioned within the cavity, a light source positioned within the cavity proximate an icon layer, and a switch configured to actuate the feedback device and the light source.

Embodiments of the third aspect of the invention can include any one or a combination of the following features:
The switch assembly further comprising a panel skin, wherein the panel skin positioned over the panel substrate and the backup layer, and further wherein a foam layer is positioned between the panel skin and the panel substrate;
The panel skin is configured to provide visual color to a user when the light source is illuminated;
An outline is bonded to the backup layer and positioned proximate the foam layer;
The outline is configured to have a first Durometer hardness proximate the backup layer, and further wherein the outline is configured to have a second Durometer hardness proximate the foam layer, the second Durometer hardness being less than the first Durometer hardness;
The icon layer includes indicia configured to be made visible by illumination of the light source;
The icon layer and indicia are color-corrected determined by the panel skin;
The light source is configured to emit different colors in response to activation of the switch;
The feedback device is configured to produce vibration when actuated; and/or
The housing is integrally formed with the panel substrate.

These and other aspects, objects, and features of the present invention will be understood and appreciated by those skilled in the art upon studying the following specification, claims, and appended drawings.

DETAILED DESCRIPTION OF THE PREFERRED EMBODIMENTS

Figure 2:
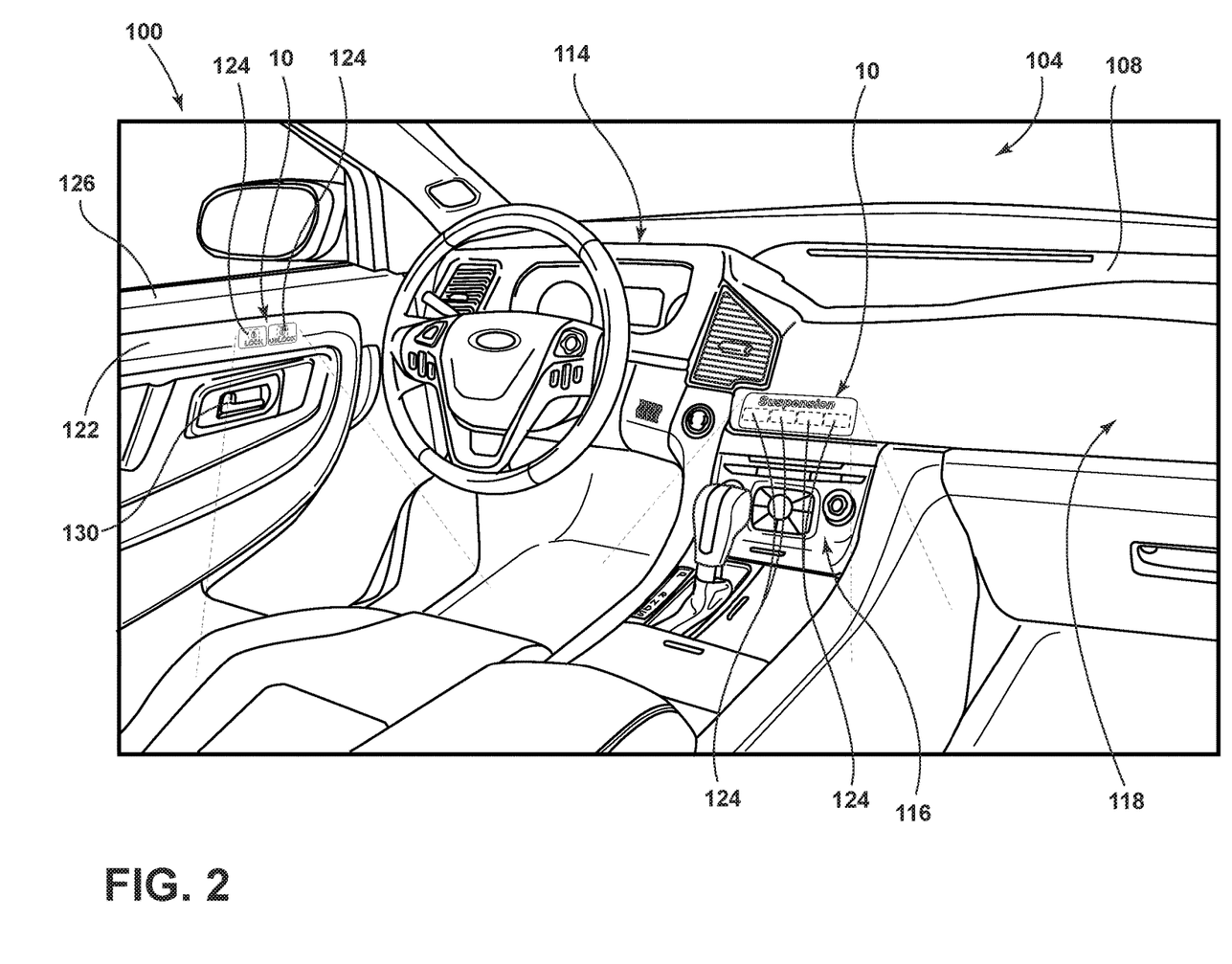
FIG. 2 is a side perspective view of an interior of a vehicle.

For purposes of description herein the terms "upper," "lower," "right," "left," "rear," "front," "vertical," "horizontal," and derivatives thereof shall relate to the device as oriented in FIG. 2. However, it is to be understood that the device may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As required, detailed examples of the present invention are disclosed herein. However, it is to be understood that the disclosed examples are merely exemplary of the invention that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present invention.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises" does not, without more constraints, preclude the existence of additional identical elements in the process, method, article, or apparatus that comprises the element.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

Referring to FIGS. 1-7, reference numeral 10 generally designates a switch assembly including a housing 14 configured to couple to a trim panel 122 and defining a cavity 22. A feedback device 26 is coupled to the housing 14 and positioned within the cavity 22. A printed circuit board (PCB) 30 is coupled to the feedback device 26. A proximity sensor 34 is coupled to an electrical connector 38 and configured to actuate the feedback device 26. A light source 42 is coupled to the printed circuit board 30 and configured to luminesce in response to actuation of the proximity sensor 34. The trim panel 122 includes a panel substrate 18 coupled to a backup layer 54, and an icon layer 50 is positioned within the cavity 22 and coupled to the backup layer 54. An outline 46 is positioned about a periphery of the backup layer 54, and a translucent panel skin 58 bonded to a foam layer 210 positioned over the panel substrate 18, wherein the panel skin 58 stretches over the panel substrate 18 and the backup layer 54.

Figure 1A:
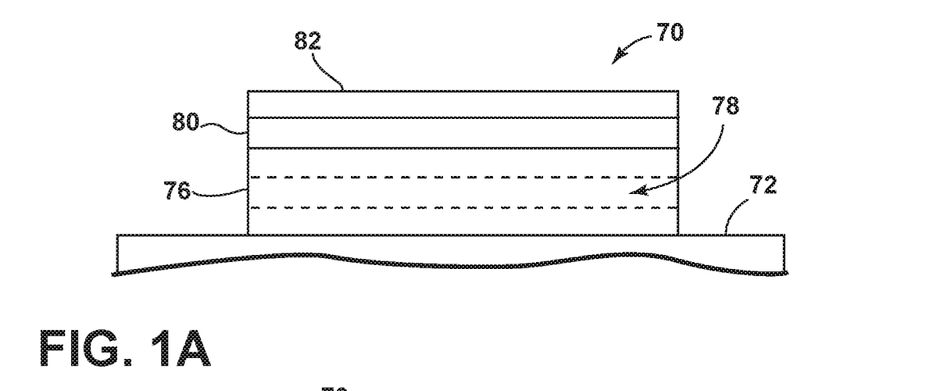
FIG. 1A is a side view of a luminescent structure rendered as a coating, according to various examples.
Figure 1B:
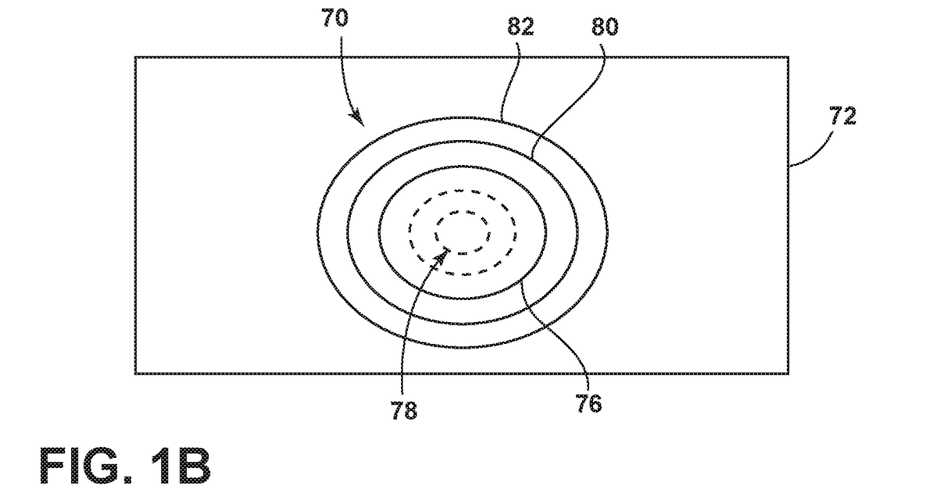
FIG. 1B is a top view of a luminescent structure rendered as a discrete particle, according to various examples.
Figure 1C:
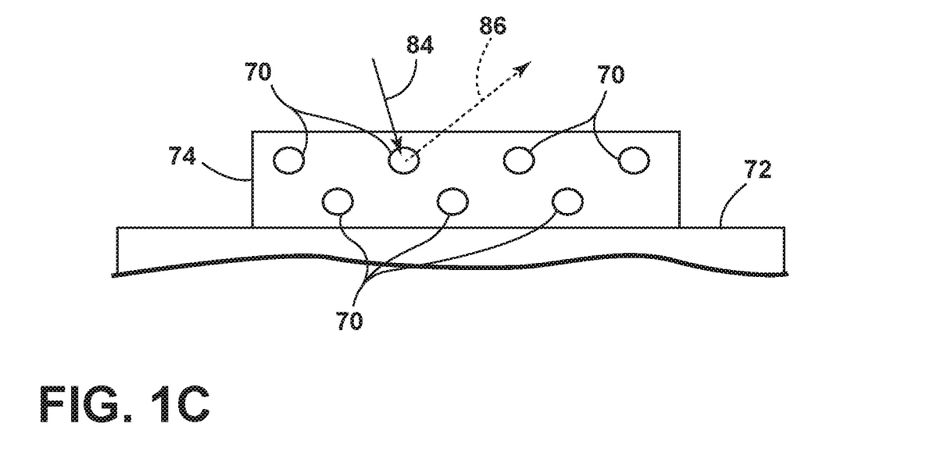
FIG. 1C is a side view of a plurality of luminescent structures rendered as discrete particles and incorporated into at least one separate structure.

Referring to FIGS. 1A-1C, various exemplary examples of luminescent structures 70 are shown, each capable of being coupled to a substrate 72, which may correspond to a vehicle fixture or vehicle-related piece of equipment. In FIG. 1A, the luminescent structure 70 is generally shown rendered as a coating (e.g., a film) that may be applied to a surface of the substrate 72. In FIG. 1B, the luminescent structure 70 is generally shown as a discrete particle capable of being integrated with a substrate 72. In FIG. 1C, the luminescent structure 70 is generally shown as a plurality of discrete particles that may be incorporated into a support medium 74 (e.g., a film) that may then be applied (as shown) or integrated with the substrate 72.

At the most basic level, a given luminescent structure 70 includes an energy conversion layer 76 that may include one or more sublayers, which are exemplarily shown in broken lines in FIGS. 1A and 1B. Each sublayer of the energy conversion layer 76 may include one or more luminescent materials 78 having energy converting elements with phosphorescent or fluorescent properties. Each luminescent material 78 may become excited upon receiving an emitted light 84 of a specific wavelength, thereby causing the light to undergo a conversion process. Under the principle of down conversion, the emitted light 84 is converted into a longer-wavelength, converted light 86 that is outputted from the luminescent structure 70. Conversely, under the principle of up conversion, the emitted light 84 is converted into a shorter wavelength light that is outputted from the luminescent structure 70. When multiple distinct wavelengths of light are outputted from the luminescent structure 70 at the same time, the wavelengths of light may mix together and be expressed as a multicolor light.

The energy conversion layer 76 may be prepared by dispersing the luminescent material 78 in a polymer matrix to form a homogenous mixture using a variety of methods. Such methods may include preparing the energy conversion layer 76 from a formulation in a liquid carrier support medium 74 and coating the energy conversion layer 76 to a desired substrate 72. The energy conversion layer 76 may be applied to a substrate 72 by painting, screen-printing, spraying, slot coating, dip coating, roller coating, and bar coating. Alternatively, the energy conversion layer 76 may be prepared by methods that do not use a liquid carrier support medium 74. For example, the energy conversion layer 76 may be rendered by dispersing the luminescent material 78 into a solid-state solution (homogenous mixture in a dry state) that may be incorporated in a polymer matrix, which may be formed by extrusion, injection molding, compression molding, calendaring, thermoforming, etc. The energy conversion layer 76 may then be integrated into a substrate 72 using any methods known to those skilled in the art. When the energy conversion layer 76 includes sublayers, each sublayer may be sequentially coated to form the energy conversion layer 76. Alternatively, the sublayers can be separately prepared and later laminated or embossed together to form the energy conversion layer 76. Alternatively still, the energy conversion layer 76 may be formed by coextruding the sublayers.

In various examples, the converted light 86 that has been down converted or up converted may be used to excite other luminescent material(s) 78 found in the energy conversion layer 76. The process of using the converted light 86 outputted from one luminescent material 78 to excite another, and so on, is generally known as an energy cascade and may serve as an alternative for achieving various color expressions. With respect to either conversion principle, the difference in wavelength between the emitted light 84 and the converted light 86 is known as the Stokes shift and serves as the principal driving mechanism for an energy conversion process corresponding to a change in wavelength of light. In the various examples discussed herein, each of the luminescent structures 70 may operate under either conversion principle.

Referring back to FIGS. 1A and 1B, the luminescent structure 70 may optionally include at least one stability layer 80 to protect the luminescent material 78 contained within the energy conversion layer 76 from photolytic and thermal degradation. The stability layer 80 may be configured as a separate layer optically coupled and adhered to the energy conversion layer 76. Alternatively, the stability layer 80 may be integrated with the energy conversion layer 76. The luminescent structure 70 may also optionally include a protective layer 82 optically coupled and adhered to the stability layer 80 or other layer (e.g., the conversion layer 76 in the absence of the stability layer 80) to protect the luminescent structure 70 from physical and chemical damage arising from environmental exposure. The stability layer 80 and/or the protective layer 82 may be combined with the energy conversion layer 76 through sequential coating or printing of each layer, sequential lamination or embossing, or any other suitable means.

According to various examples, the luminescent material 78 may include organic or inorganic fluorescent dyes including rylenes, xanthenes, porphyrins, and phthalocyanines. Additionally, or alternatively, the luminescent material 78 may include phosphors from the group of Ce-doped garnets such as YAG:Ce and may be a short-persistence luminescent material 78. For example, an emission by $Ce^{3+}$ is based on an electronic energy transition from $4D^1$ to $4f^1$ as a parity allowed transition. As a result of this, a difference in energy between the light absorption and the light emission by $Ce^{3+}$ is small, and the luminescent level of $Ce^{3+}$ has an ultra-short lifespan, or decay time, of $10^{-8}$ to $10^{-7}$ seconds (10 to 100 nanoseconds). The decay time may be defined as the time between the end of excitation from the emitted light 84 and the moment when the light intensity of the converted light 86 emitted from the luminescent structure 70 drops below a minimum visibility of 0.32 $mcd/m^2$. A visibility of 0.32 $mcd/m^2$ is roughly 100 times the sensitivity of the dark-adapted human eye, which corresponds to a base level of illumination commonly used by persons of ordinary skill in the art.

Figures 3A, 3B:
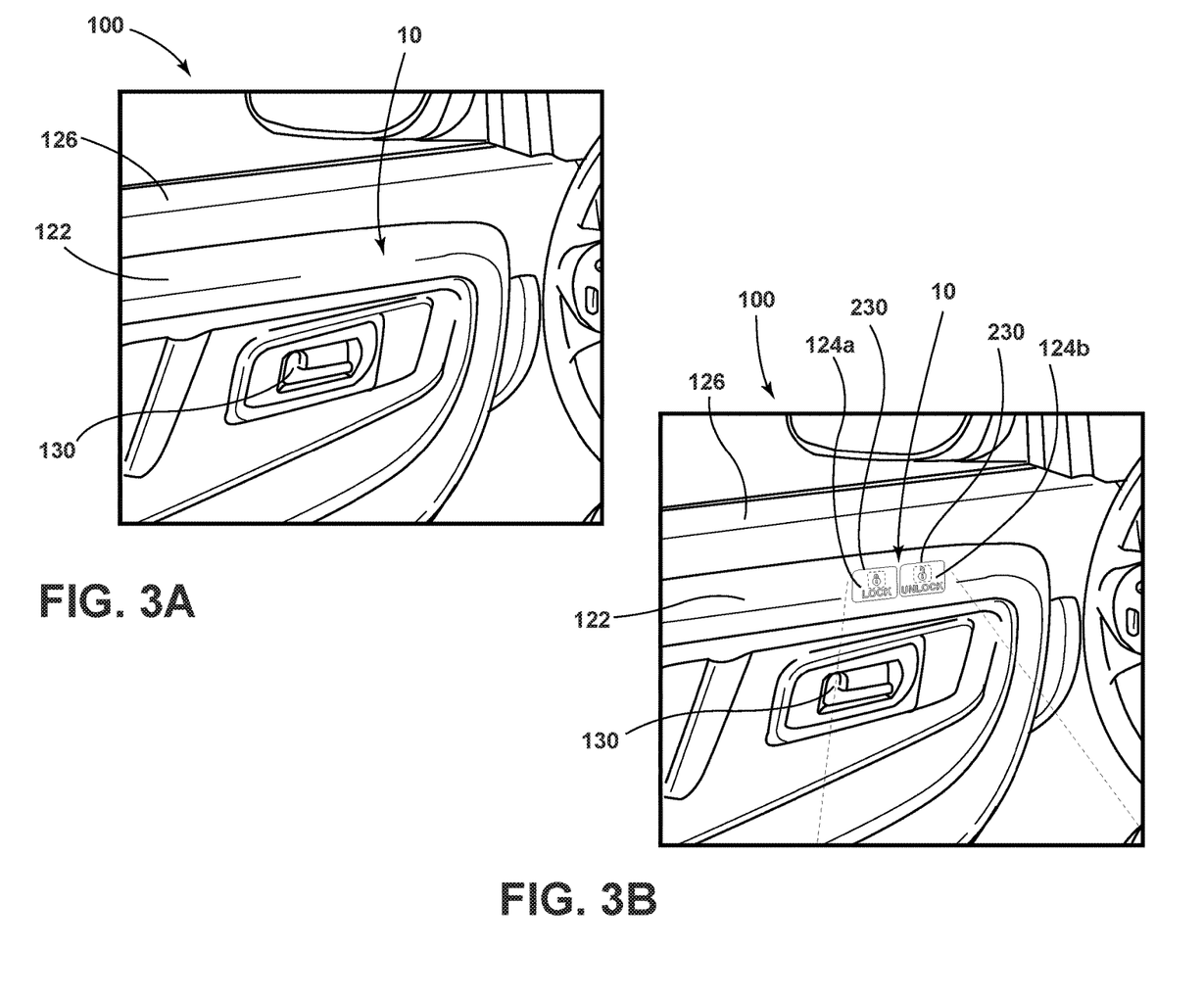
FIG. 3A is a side perspective view of a trim panel of the vehicle of FIG. 2 with a plurality of hidden switches.
FIG. 3B is a side perspective view of the trim panel of FIG. 3A with a plurality of illuminated switches.

According to various examples, a $Ce^{3+}$ garnet may be utilized, which has a peak excitation spectrum that may reside in a shorter wavelength range than that of conventional YAG:Ce-type phosphors. Accordingly, $Ce^{3+}$ has short-persistence characteristics such that its decay time may be 100 milliseconds or less. Therefore, in various examples, the rare earth aluminum garnet type Ce phosphor may serve as the luminescent material 78 with ultra-short-persistence characteristics, which can emit the converted light 86 by absorbing purple to blue emitted light 84 emanated from light sources 62 (FIG. 3). According to various examples, a ZnS:Ag phosphor may be used to create a blue-converted light 86. A ZnS:Cu phosphor may be utilized to create a yellowish-green converted light 86. A $Y_2O_2S$:Eu phosphor may be used to create red converted light 86. Moreover, the aforementioned phosphorescent materials may be combined to form a wide range of colors, including white light. It will be understood that any short-persistence luminescent material 78 known in the art may be utilized without departing from the teachings provided herein.

Additionally, or alternatively, the luminescent material 78, according to various examples, positioned within the luminescent structure 70 may include a long-persistence luminescent material 78 that emits the converted light 86, once charged by the emitted light 84. The emitted light 84 may be emitted from any excitation source (e.g., any natural light source, and/or any artificial light sources). The long-persistence luminescent material 78 may be defined as having a long decay time due to its ability to store the emitted light 84 and release the converted light 86 gradually, for a period of several minutes or hours, once the emitted light 84 is no longer present.

The long-persistence luminescent material 78, according to various examples, may be operable to emit light at or above an intensity of 0.32 $mcd/m^2$ after a period of 10 minutes. Additionally, the long-persistence luminescent material 78 may be operable to emit light above or at an intensity of 0.32 $mcd/m^2$ after a period of 30 minutes and, in various examples, for a period substantially longer than 60 minutes (e.g., the period may extend 24 hours or longer, and in some instances, the period may extend 48 hours). Accordingly, the long-persistence luminescent material 78 may continually illuminate in response to excitation from any one or more light sources 62 that emit the emitted light 84, including, but not limited to, natural light sources (e.g., the sun) and/or any artificial light sources 62. The periodic absorption of the emitted light 84 from any excitation source may provide for a substantially sustained charge of the long-persistence luminescent material 78 to provide for consistent passive illumination. In various examples, a light sensor may monitor the illumination intensity of the luminescent structure 70 and actuate an excitation source when the illumination intensity falls below a predefined intensity level.

The long-persistence luminescent material 78 may correspond to alkaline earth aluminates and silicates, for example, doped di-silicates, or any other compound that is capable of emitting light for a period of time once the emitted light 84 is no longer present. The long-persistence luminescent material 78 may be doped with one or more ions, which may correspond to rare earth elements, for example, $Eu^{2+}$, $Tb^{3+}$, and/or $Dy^{3+}$. According to one non-limiting exemplary example, the luminescent structure 70 includes a phosphorescent material in the range of about 30% to about 55%, a liquid carrier medium in the range of about 25% to about 55%, a polymeric resin in the range of about 15% to about 35%, a stabilizing additive in the range of about 0.25% to about 20%, and performance-enhancing additives in the range of about 0% to about 5%, each based on the weight of the formulation.

The luminescent structure 70, according to various examples, may be a translucent white color, and in some instances reflective, when unilluminated. Once the luminescent structure 70 receives the emitted light 84 of a particular wavelength, the luminescent structure 70 may emit any color light (e.g., blue or red) therefrom at any desired brightness. According to various examples, a blue emitting phosphorescent material may have the structure $Li_2ZnGeO_4$ and may be prepared by a high-temperature solid-state reaction method or through any other practicable method and/or process. The afterglow may last for a duration of 2-8 hours and may originate from the emitted light 84 and d-d transitions of $Mn^{2+}$ ions.

According to an alternate non-limiting example, 100 parts of a commercial solvent-borne polyurethane, such as Mace resin 107-268, having 50% solids polyurethane in toluene/isopropanol, 125 parts of a blue-green long-persistence phosphor, such as Performance Indicator PI-BG20, and 12.5 parts of a dye solution containing 0.1% Lumogen Yellow F083 in dioxolane may be blended to yield a low rare earth mineral luminescent structure 70. It will be understood that the compositions provided herein are non-limiting examples. Thus, any phosphor known in the art may be utilized within the luminescent structure 70 without departing from the teachings provided herein. Moreover, it is contemplated that any long-persistence phosphor known in the art may also be utilized without departing from the teachings provided herein.

Referring now to FIG. 2, the interior of a vehicle 100 is generally illustrated having a cabin 104 including an instrument panel 108 spanning the front of the cabin 104. The instrument panel 108 may be divided into a driver side portion 114, a center-stack portion 116, and a passenger side portion 118. Each of these portions 114, 116, 118 may serve different functions and include various electrical and mechanical components. One or more of these portions 114, 116, 118 may include the switch assembly 10 to provide user input to the various electrical mechanical components. For example, as shown in the illustrated embodiment, suspension control may be controlled from the center-stack portion 116. It is contemplated that multiple switch assemblies 10 could be utilized for any function usually controlled by a user from within the interior of the vehicle 100 including, for example, power buttons, audio control, heating ventilation and air conditioning (HVAC) control, etc. As shown in the illustrated embodiment, the switch assembly 10 may be positioned within a trim panel 122 of the vehicle 100 including, for example, on a door 126 of the vehicle 100, or on any surface of the vehicle 100. Each switch assembly 10 includes a plurality of proximity switches 124 arranged close to one another. The various proximity switches 124 may control any of a number of vehicle devices and functions and may be configured to interact with any system within the vehicle 100.

Figures 4A, 4B:
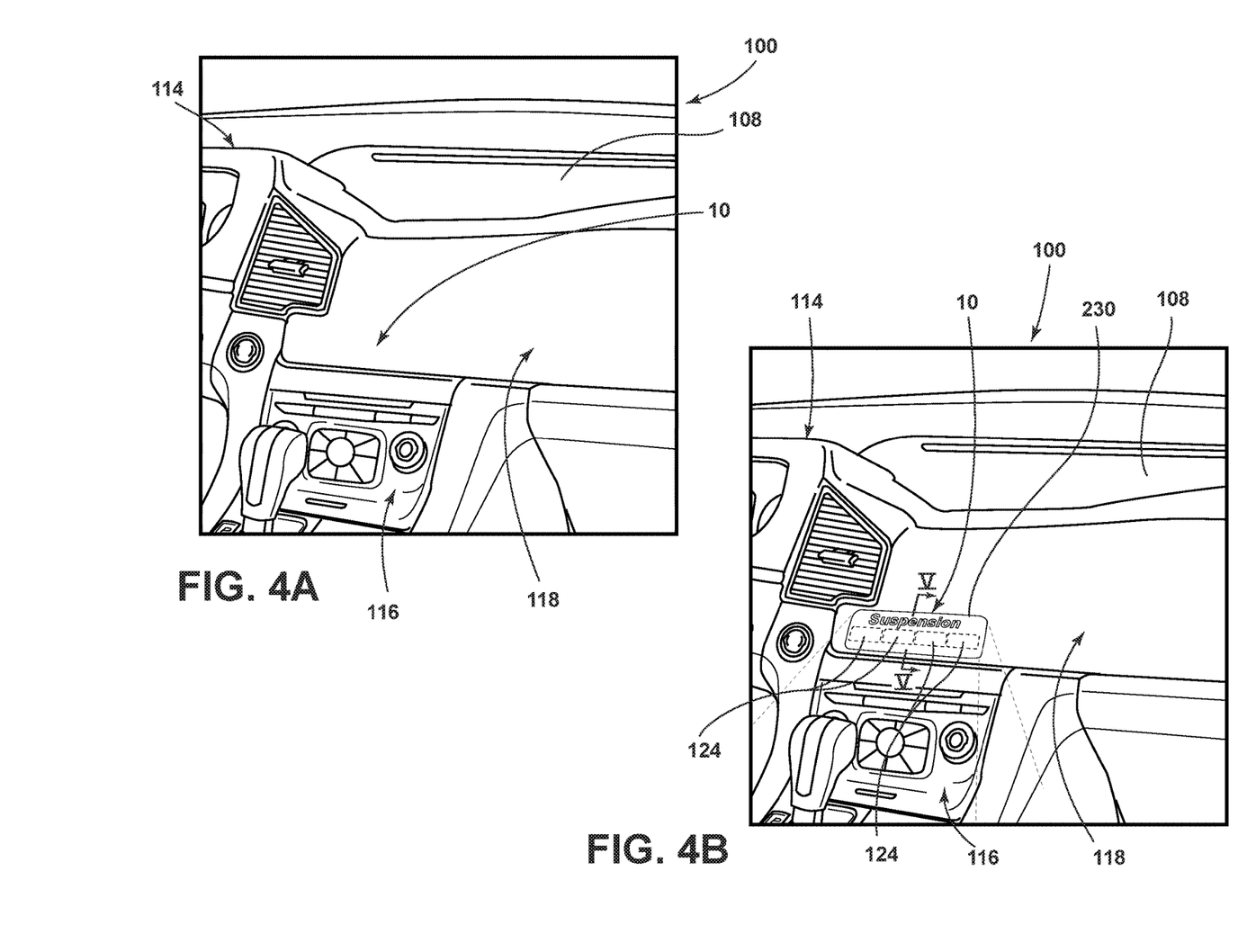
FIG. 4A is a side perspective view of a console of the vehicle of FIG. 2 with a plurality of hidden switches.
FIG. 4B is a side perspective view of the console of FIG. 4A with a plurality of illuminated switches.

Referring now to FIGS. 3A-4B, the switch assembly 10 may be positioned in any portion of the vehicle 100, such as, for example, above the trim panel 122 surrounding a door handle 130 (FIGS. 3A and 3B) or the center-stack portion 116 (FIGS. 4A-4B). FIG. 3A shows the trim panel 122 of the door 126 surrounding the door handle 130 and including the switch assembly 10. The switch assembly 10 is not illuminated and cannot be seen by the user. FIG. 3B shows the door 126 including the switch assembly 10 with the switch assembly 10 illuminated, making the plurality of proximity switches 124 visible to the user. Similarly, FIG. 4A shows the center-stack portion 116 including the switch assembly 10. The switch assembly 10 is not illuminated and cannot be seen by the user. FIG. 4B shows the center-stack portion 116 with the switch assembly 10 illuminated, allowing the user to select from the plurality of proximity switches 124. The plurality of proximity switches 124 is positioned in any way to allow the switch assembly 10 to take the place of a switch, button, etc. For example, the switch assembly 10 may be used as a door lock control, as shown in FIGS. 3A and 3B, or as a control for another feature of the vehicle 100, such as suspension as shown in FIGS. 4A and 4B. However, it will be understood that the uses shown herein are exemplary only, and the switch assembly 10 may be used in any manner that allows it to function as a switch for any vehicle feature and be positioned within the interior of the vehicle 100.

Figure 5:
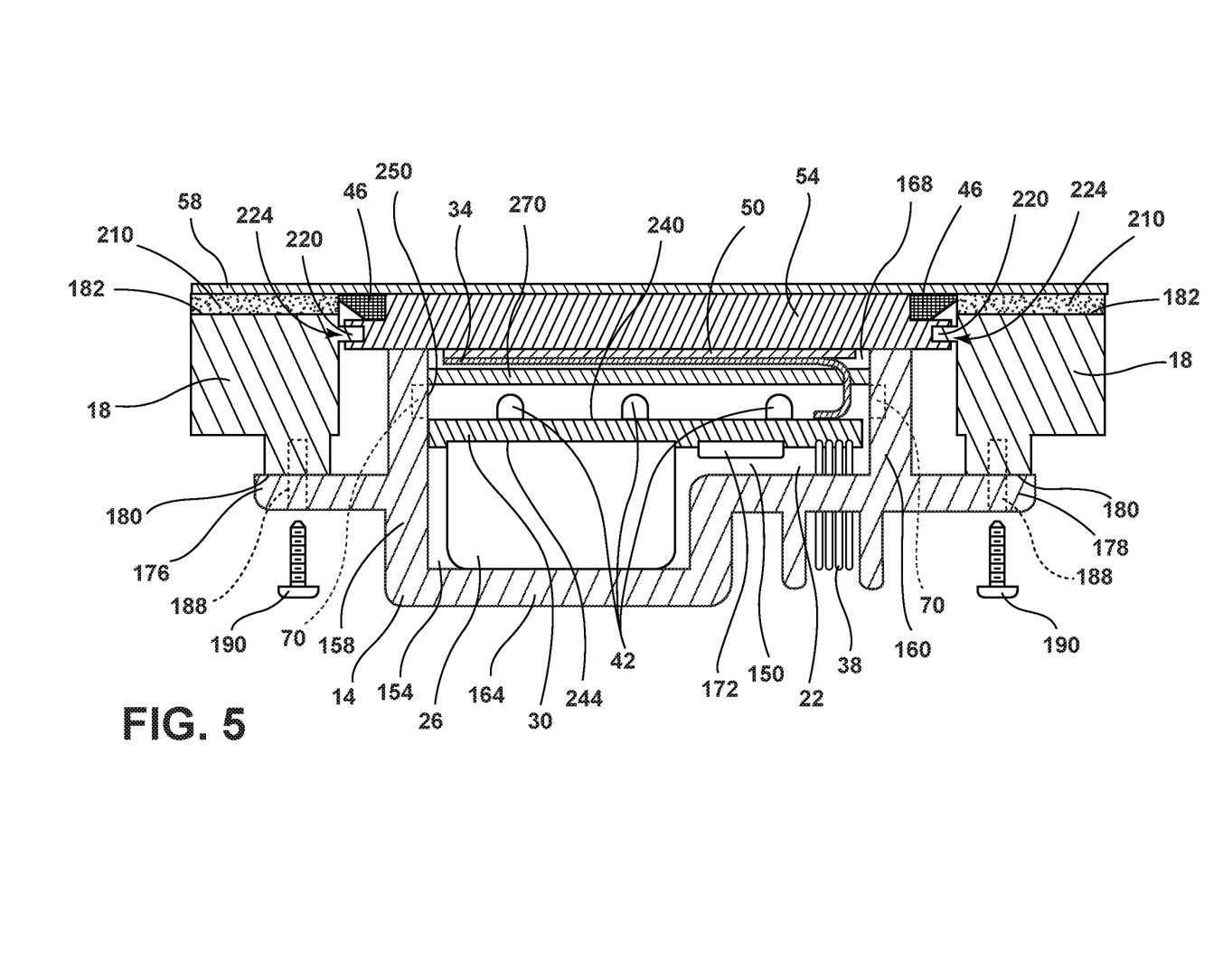
FIG. 5 is a cross-sectional view taken at line V-V of FIG. 4B.

Referring now to FIG. 5, the switch assembly 10 includes the housing 14 configured to operably couple to the panel substrate 18. The housing 14 may be rigid or flexible to allow for various locations of the switch assembly 10 and may be formed using any injection molding technique known in the art. The housing 14 includes a main portion 150 and an extended portion 154, the main portion 150 having first and second lateral sides 158, 160 joined by a rear side 164. The first and second lateral sides 158, 160 define a front opening 168 of the housing 14. The rear side 164 of the main portion of the housing 14 extends to define the extended portion 154 of the housing 14. Both the main portion 150 and the extended portion 154 form the cavity 22. The main portion 150 of the housing 14 contains the PCB 30 including the light source 42, at least one control circuit 172, an electrical connector 38, the proximity sensor 34, and the icon layer 50. The feedback device 26 is housed in the extended portion 154 of the housing 14 and protrudes into the main portion 150 to operably couple with the PCB 30. The housing 14 further includes lateral protrusions 176, 178 extending perpendicularly to the lateral sides 158, 160 and configured to facilitate coupling the housing 14 to a first side 180 of the panel substrate 18. The panel substrate 18 may define apertures 188 configured to receive fasteners 190 of any kind known in the art. It is contemplated that the lateral protrusions 176, 178 may be coupled to the panel substrate 18 using an adhesive. Alternatively, it is contemplated that the housing 14 could be integrally formed with the panel substrate 18 such that the panel substrate 18 defines the cavity 22.

The foam layer 210 is positioned on a second side 182 of the panel substrate 18 opposite the lateral protrusions 176, 178. The foam layer 210 is positioned between the panel substrate 18 and the panel skin 58. The foam layer 210 may have Durometer hardness from approximately 0 Shore OO and approximately 100 Shore OO, depending on various factors affecting the use of the switch assembly 10, such as location and surroundings. It is contemplated that the switch assembly 10 may be manufactured without the foam layer 210 without departing from the scope of the present disclosure.

Referring still to FIG. 5, when the housing 14 is operably coupled to the panel substrate 18, a clear, hard backup layer 54 extends over the front opening 168 of the housing 14. The backup layer 54 is operably coupled to the panel substrate 18, and extends past the first and second lateral sides 158, 160 of the housing. The backup layer 54 is larger than the front opening 168 of the housing 14 to prevent the user from pushing at a transition seam between the backup layer 54 and the foam layer 210. The backup layer 54 may be coupled to the panel substrate 18 by protrusions 220 extending laterally from the panel substrate 18 towards the housing 14. The protrusions 220 may be received by apertures 224 configured to secure the backup layer 54 over the front opening 168 defined by the housing 14. The backup layer 54 may be formed of a translucent material, for example, polymers. The backup layer 54 may have a Durometer hardness between approximately 0 Shore OO and approximately 100 Shore OO to provide a solid and protective barrier over the cavity 22 of the housing 14.

The outline 46 is positioned about the periphery of the backup layer 54 and is made of ethylene propylene diene monomer rubber. The outline 46 may have a Durometer hardness from about 40 Shore A to about 90 Shore A. The outline 46 is bonded to the backup layer 54 and is positioned to be level with the foam layer 210. The outline 46 has a first Durometer hardness where it is bonded to the backup layer 54 and a second Durometer hardness at the foam layer 210, with the Durometer hardness decreasing gradually from the first hardness to the second hardness. This decrease in the Durometer hardness eliminates damage to the panel skin 58 that may result from having the panel skin 58 positioned over a sharp transition from a hard surface to a softer foam, such as, for example, separation of the materials or tearing of the foam layer 210. It is contemplated that the outline 46 may be made of any material providing the necessary Durometer hardness and allowing for a gradual decrease in the Durometer hardness across the outline 46.

Referring now to FIGS. 3A-5, the panel skin 58 extends over the foam layer 210, the outline 46, and the clear backup layer 54 and is bonded to the foam layer 210. The panel skin 58 is designed to conceal the switch assembly when the light source 42 is not illuminated and provides visual color aesthetically compatible with the interior of the vehicle 100. When the light source 42 is illuminated, the emitted light 84 illuminates through the panel skin 58 making the switch assembly 10 visible to the user.

Referring again to FIG. 5, the icon layer 50 is positioned beneath the backup layer 54 so that it is visible through the backup layer 54 and through the panel skin 58 when the light source 42 is illuminated. The icon layer 50 may include indicia 230 configured to be viewed by the user when the light source 42 is illuminated (FIGS. 3A and 4A). The icon layer 50 may be color corrected according to the selected panel skin 58 to provide a specific color when the light source 42 is illuminated, with the color of the icon layer 50 and the color of the panel skin 58 cooperating to produce a predetermined color for the switch assembly 10. The icon layer 50 may be a translucent printed film and is designed to not be visible when the switch assembly 10 is not illuminated (FIGS. 3B and 4B).

Still referring to FIG. 5, the switch assembly 10 may further include the PCB 30 attached to the housing 14 and including the light source 42 and the feedback device 26. The PCB 30 may be secured within the housing 14 at any angle so the light source 42 is positioned on a first side 240 of the PCB 30 and is positioned towards the front opening 168 of the housing 14. The electrical connector 38 may be positioned on a second side 244 of the PCB 30 and may be rigid or flexible. The electrical connector 38 may connect the PCB 30 to another electronic component. The connection may be facilitated using, for example, a zero insertion force (ZIF) integrated circuit (IC) socket or any other type electrical mating assembly. For example, the electrical connector 38 may include a generally flexible tail or ribbon portion having conductive elements positioned therein to electronically couple the PCB 30 with an electronic component within the vehicle 100.

The light source 42 may be configured to emit non-focused excitation light that excites the luminescent structure 70. The light source 42 may be positioned on the first side of the PCB 30 and oriented to face towards the front opening 168 of the housing 14. In various embodiments, optics 270 may be disposed within the housing 14 to direct light from the light source 42 toward the front opening 168 of the housing 14. It is contemplated that the light source 42 may alternatively be, for example, fluorescent lighting, light emitting diodes (LEDs), organic LEDs (OLEDs), polymer LEDs (PLEDs), solid-state lighting, or any other form of lighting configured to emit light, without departing from the scope of the present disclosure. According to various embodiments, the light source 42 may be configured to emit a wavelength of excitation light that is characterized as ultraviolet (UV) light (~10-400 nanometers in wavelength), violet light (~380-450 nanometers in wavelength), blue light (~450-495 nanometers in wavelength), and/or infrared (IR) light (~700 nm-1 mm in wavelength). These wavelengths take advantage of the relative low cost attributable to those types of LEDs.

It is contemplated that the luminescent structure 70 may be positioned on an interior surface 250 within the housing 14 or on the icon layer 50. The panel skin 58 may substantially conceal the luminescent structure 70 such that the light source 42 and other components within the cavity 22 may not be visible when the light source 42 is in an unilluminated state. It will be appreciated, however, that the luminescent structure 70 may be positioned within and/or on any other component described herein without departing from the teachings provided herein.

Figure 6:
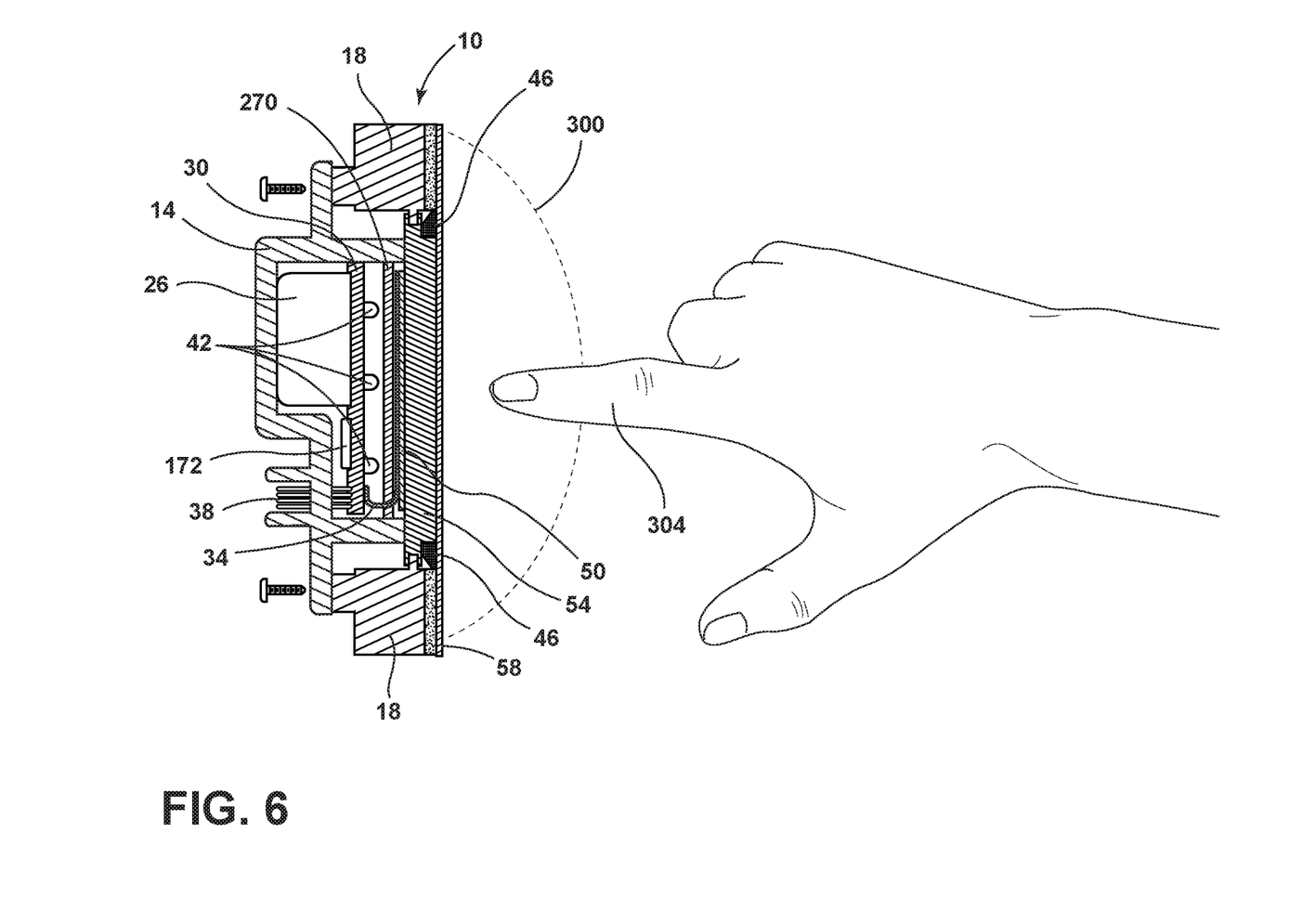
FIG. 6 is the cross-sectional view of FIG. 5 including an activation field.

Referring now to FIGS. 5-6, the switch assembly 10 may include the proximity sensor 34 that is operable to actuate a control output. In various embodiments, the proximity sensor 34 is a single or a plurality of proximity sensor(s) 34. Each of the proximity sensor(s) 34 may be configured to control at least one control output of the switch assembly 10, such as the light source 42 or the feedback device 26. According to various embodiments, the proximity sensors 34 may be implemented as capacitive sensors. It will be appreciated that other types of proximity sensors 34 may be used in addition to and/or alternatively to any other practicable sensor. Other embodiments of the proximity sensors 34 may include, but are not limited to, magnetic sensors, inductive sensors, optical sensors, resistive sensors, temperature sensors, the like, or any combination thereof.

Referring still to FIGS. 5-6, as discussed elsewhere herein, the switch assembly 10 further includes the plurality of proximity switches 124 each including one of the proximity sensor(s) 34 for providing a sense activation field 300 and control circuit 172 processing a signal associated with the sense activation field 300 of each proximity sensor 34. The targeted location for the user's finger 304 may be indicated through the indicia 230 illuminated through the icon layer 50. The control circuit 172 may detect the user's finger 304 located between two proximity switches 124, as indicated by the indicia 230, such as when the finger 304 slides across the switch assembly 10 and transitions from a first proximity switch 124*a* to a second proximity switch 124*b* (FIG. 3B). The switch assembly 10 may be configured to produce one or more feedbacks, such as tactile or visual feedback, to the user interfacing with the switch assembly 10. This feedback alerts the user that one or more of the proximity sensors 34 have been activated. The switch assembly 10 further includes the feedback device 26 generating a feedback when the finger 304 is detected between the two proximity switches 124. The feedback device 26 provides at least one feedback, such as a tactile feedback according, for example. The feedback device 26 may include a vibratory mechanism, such as an eccentric motor. It is also contemplated that the vibratory/tactile generator could be driven by a saw-tooth or a square-wave pulse modulated train with duty cycle, pulsed, overlapped duration and intensity as selectable parameters to implement the different profiles such as the "ridge," "button-tap," "button-press," and "texture" profiles. The amplitude, pattern and/or frequency of the vibration may be varied to provide different recognizable feedbacks. In one embodiment, the feedback device 26 provides a tactile feedback to the user when the user's finger 304 is detected moving or transitioning midway between two adjacent switches 124. The control circuit 172 may also detect speed of the user's finger 304 interfacing with the switch assembly 10 and may generate a feedback that varies in amplitude or frequency based on the detected speed. In addition, feedback may also be provided when an activation of one of the proximity switches 124 is detected, when the user taps on one of the switches 124, and/or when the user removes the user's finger 304 from the sense activation field 300 one of the proximity switches 124. In addition to a tactile feedback, other feedbacks may be employed including an audible tone generated by an audible tone generator, and a visual feedback, such as an indicator light. The feedback device 26 may be located within the switch assembly 10 housing 14. However, it is also contemplated that the tactile feedback device 26 may be located elsewhere, such as within the panel substrate 18.

Figure 7:
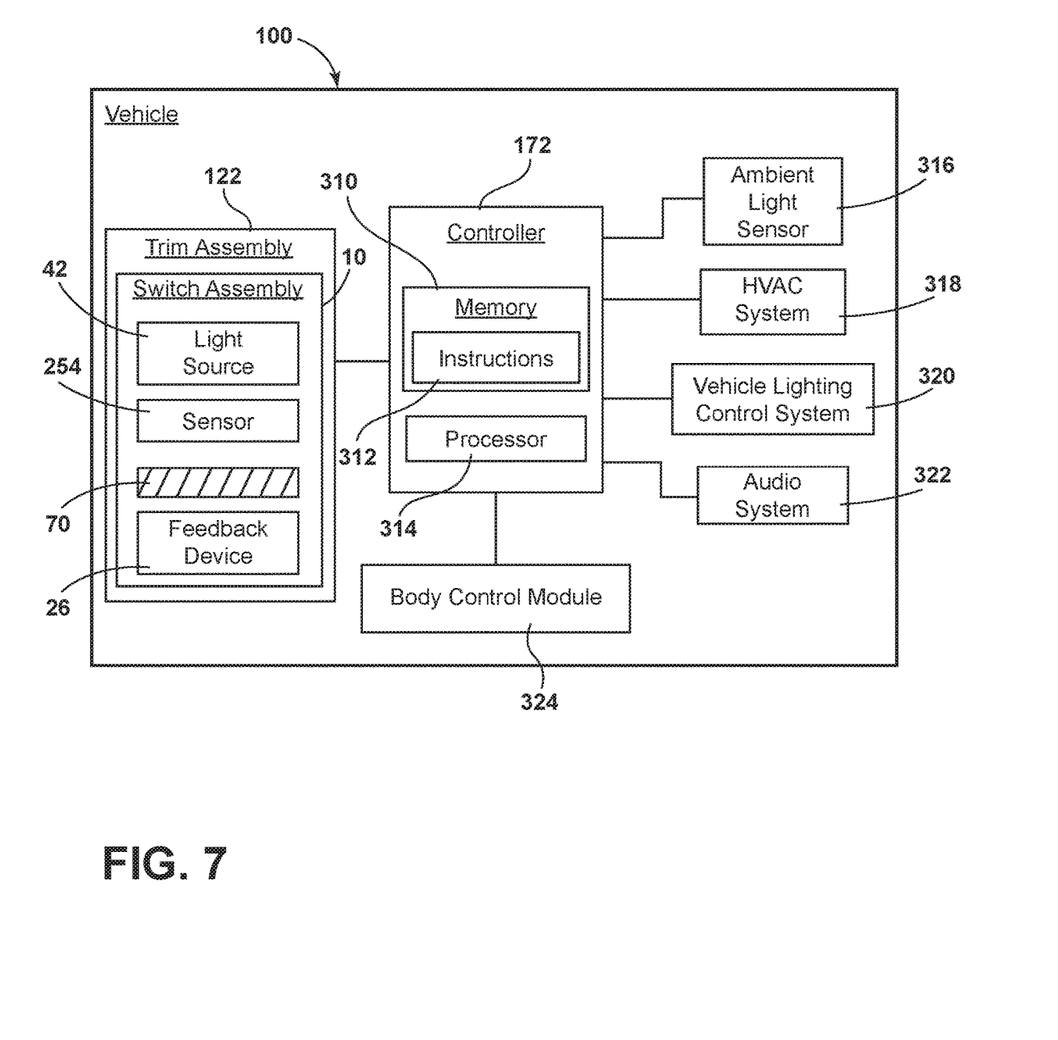
FIG. 7 is a box diagram of a vehicle including a hidden switch assembly.

Referring to FIG. 7, the light sources 42 of the switch assembly 10 are operably connected to the controller 174. The light sources 42 may be controlled by a standalone controller or are otherwise integrated with an existing vehicle system. The controller 174 includes a memory 310 having instructions 312 stored thereon that are executable by a processor 314. The instructions 312 may generally relate to ways in which to operate the light sources 42 to affect the manner in which the switch assembly 10 illuminates or luminesces. The controller 174 may also communicate with other vehicle devices such as, but not limited to, an ambient light sensor 316, an HVAC system 318, a vehicle lighting control system 320, an audio system 322, as well as a body control module 324 of the vehicle 100. By leveraging these vehicle devices, the switch assembly 10 may provide a variety of functional and/or aesthetic features and allow user input for the various devices. For example, the switch assembly 10 may control the HVAC system 318 and the audio system 322, or the switch assembly 10 may control when the user unlocks or locks the vehicle 100. While a few specific examples have been provided herein, it will be apparent to those of ordinary skill in the art that the switch assembly 10, or a plurality of switch assemblies 10, may be used to control other devices without departing from the scope of the present disclosure.

Referring now to FIGS. 1-7, in operation, the switch assembly 10 is operable between two states. First, the switch assembly 10 may be hidden, as shown in FIGS. 3A and 4A. Second, the switch assembly 10 may be illuminated by the light source(s) 42, as shown in FIGS. 3B and 4B. The switch assembly 10 is hidden until activated, which may be caused by a disruption such as, for example, the user's finger 304 interrupting the sense activation field 300 to register proximity over one of the proximity sensors 34, the pressing of one of the switches 124, or the signaling of the other vehicle systems, such as, for example, the HVAC system 318, the vehicle lighting control system 320, or the audio system 322. It is contemplated that in the event that input from the user was needed to the switch assembly 10 (e.g. signaling that the exterior temperature has dropped for option to activate defrost, a change regarding the suspension needing user input, etc.), the light source 42 would illuminate, making the switch assembly 10 visible to the user. When the light source 42 is illuminated, in various embodiments, the luminescent structure 70 gathers any excess light and re-emits the light as converted light 86 (FIG. 1). Advantageously, this increases the efficiency of the light source 42 for illuminating the switch assembly 10. The light from the light source 42 illuminates through the optics 270, the icon layer 50, and the backup layer 54 and is visible through the panel skin 58. The icon layer 50 may be colorless or color-corrected to cooperate with the panel skin 58 to show the user a predetermined color for the switch assembly 10. As discussed elsewhere herein, the backup layer 54 and the outline 46 further protect the switch assembly 10 from pushing by the user on or near the indicia 230 of the icon layer 50, particularly at the seam of the foam layer 210 and the backup layer 54. When the user input is received, the switch assembly 10 returns to the hidden state.

It will be understood by one having ordinary skill in the art that construction of the described device and other components may not be limited to any specific material. Other exemplary embodiments of the device disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structure without departing from the concepts of the present invention, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

What is claimed is:

1. A switch assembly comprising:
   a housing having first and second sides and defining a cavity and an opening, the opening in communication with the cavity;
   a trim panel coupled with the housing, wherein the trim panel includes:
      a backup layer positioned to cover the opening, wherein the backup layer extends beyond the first and second sides of the housing and defines an aperture;
      a panel substrate including a protrusion, wherein the protrusion is received by the aperture of the backup layer to couple the panel substrate with the backup layer;
      an icon layer positioned within the cavity and coupled to the backup layer;
      an outline positioned about a periphery of the backup layer;
      a foam layer positioned over the panel substrate; and
      a panel skin bonded to the foam layer, wherein the panel skin stretches over the panel substrate and the backup layer;
   a feedback device coupled to the housing and positioned within the cavity;
   a printed circuit board coupled to the feedback device;
   a proximity sensor coupled to a connector and configured to actuate the feedback device; and
   a light source coupled to the printed circuit board and configured to luminesce in response to actuation of the proximity sensor.

2. The switch assembly of claim 1, wherein the light source is positioned on a first opposing side of the printed circuit board, and further wherein the feedback device is positioned on a second opposing side of the printed circuit board.

3. The switch assembly of claim 1, wherein the light source is configured to change color in response to activation of the proximity sensor.

4. A switch assembly for a vehicle comprising:
   a housing coupled to a panel and having first and second sides defining an opening, wherein the housing defines a cavity in communication with the opening and containing a feedback device coupled to a first side of a printed circuit board;
   a backup layer positioned over the opening of the housing and at least partially abutting the first and second sides of the housing;
   a panel substrate coupled with the backup layer;
   an outline bonded to the backup layer, wherein the outline is spaced apart from the housing by the backup layer;
   a foam layer positioned over the panel substrate and positioned flush with the outline;
   an icon layer positioned within the cavity;
   a panel skin positioned over the backup layer; and
      a light source coupled to a second side of the printed circuit board, wherein the light source is configured to illuminate through the icon layer and the panel skin.

5. The switch assembly of claim 4, wherein the backup layer and the foam layer define a space configured to receive the outline, and further wherein the panel skin is coupled to the foam layer and positioned on top of the backup layer.

6. The switch assembly of claim 4, wherein the backup layer and the icon layer are translucent.

7. The switch assembly of claim 4, wherein the icon layer includes indicia configured to be illuminated by the light source.

8. The switch assembly of claim 7, wherein the indicia include a luminescent material configured to luminesce in response to illumination of the light source.

9. The switch assembly of claim 4, wherein the panel skin is configured to conceal the switch assembly when the light source is not illuminated.

10. A switch assembly comprising:
    a housing defining a cavity and an opening, the opening in communication with the cavity;
    a backup layer positioned over the opening;
    a panel substrate coupled with the backup layer;
    a foam layer positioned over a portion of the panel substrate;
    an outline bonded to the backup layer proximate the foam layer, wherein the outline has a first hardness proximate the backup layer and a second hardness proximate the foam layer, and further wherein the second hardness is less than the first hardness;
    a feedback device positioned within the cavity;
    a light source positioned within the cavity proximate an icon layer; and
    a switch configured to actuate the feedback device and the light source.

11. The switch assembly of claim 10, further comprising:
    a panel skin, wherein the panel skin positioned over the panel substrate and the backup layer, and further wherein the foam layer is positioned between the panel skin and the panel substrate.

12. The switch assembly of claim 11, wherein the panel skin is configured to provide visual color to a user when the light source is illuminated.

13. The switch assembly of claim 11, wherein the icon layer includes indicia configured to be made visible by illumination of the light source.

14. The switch assembly of claim 13, wherein the icon layer and indicia are color-corrected as determined by the panel skin.

15. The switch assembly of claim 10, wherein the light source is configured to emit different colors in response to activation of the switch.

16. The switch assembly of claim 10, wherein the switch is a proximity switch.

17. The switch assembly of claim 10, wherein the feedback device is configured to produce vibrations when actuated.

18. The switch assembly of claim 10, wherein the housing is integrally formed with the panel substrate.

* * * * *